(12) United States Patent
Genei et al.

(10) Patent No.: US 8,417,072 B2
(45) Date of Patent: Apr. 9, 2013

(54) LIGHT EMITTING DEVICE AND OPTICAL TRANSMISSION SYSTEM

(75) Inventors: Koichi Genei, Fukuoka-ken (JP); Kenji Fujimoto, Fukuoka-ken (JP); Miwa Ishida, Fukuoka-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 237 days.

(21) Appl. No.: 13/030,433

(22) Filed: Feb. 18, 2011

(65) Prior Publication Data

US 2012/0027341 A1 Feb. 2, 2012

(30) Foreign Application Priority Data

Jul. 27, 2010 (JP) ................................. 2010-167887

(51) Int. Cl.
*G02B 6/12* (2006.01)
(52) U.S. Cl.
USPC .......................................................... 385/14
(58) Field of Classification Search .................. None
See application file for complete search history.

(56) References Cited

U.S. PATENT DOCUMENTS

| 2008/0232418 | A1* | 9/2008 | Anan ......................... 372/50.11 |
| 2011/0261849 | A1* | 10/2011 | Shinagawa et al. ......... 372/45.01 |
| 2012/0027341 | A1* | 2/2012 | Genei et al. ..................... 385/14 |

FOREIGN PATENT DOCUMENTS

| JP | 05-206588 | 8/1993 |
| JP | 2004-241462 | 8/2004 |
| JP | 2008-159626 | 7/2008 |

\* cited by examiner

*Primary Examiner* — Sung Pak
(74) *Attorney, Agent, or Firm* — Turocy & Watson, LLP

(57) ABSTRACT

According to one embodiment, a light emitting device includes a substrate, a light emitting layer, a first conductivity type layer, a first and a second distributed Bragg reflector layer. The first conductivity type layer is provided between the substrate and the light emitting layer. The first reflector layer is provided between the first conductivity type layer and the substrate. First and second layers are alternately stacked therein. The second layers have refractive index different from that of the first layers. The first reflector layer has a center wavelength substantially same as emission wavelength of emission light. The second reflector layer is provided between the light emitting layer and the first reflector layer. Third and fourth layers are alternately stacked therein. The fourth layers have refractive index different from that of the third layers. The second reflector layer has a center wavelength longer than the center wavelength of the first reflector layer.

20 Claims, 6 Drawing Sheets

LIGHT EMITTING DEVICE AND OPTICAL TRANSMISSION SYSTEM

CROSS-REFERENCE TO RELATED APPLICATIONS

This application is based upon and claims the benefit of priority from the prior Japanese Patent Application No. 2010-167887, filed on Jul. 27, 2010; the entire contents of which are incorporated herein by reference.

FIELD

Embodiments described herein relate generally to a light emitting device and an optical transmission system.

BACKGROUND

Use of an optical fiber for connection between an optical transmitter and an optical receiver reduces noise generation and facilitates signal transmission resistant to the influence of electromagnetic noise.

A light emitting device can be used as a source of the optical transmitter, and a plastic fiber can be used as an optical fiber. Then, by a simple configuration, it is possible to provide data transmission between electronic equipments, control of industrial equipments, and optical communication. In this case, for a transmission rate of 100 Mbps, the fall time to 10% of the peak value at the falling edge of the optical pulse is required to be e.g. 10 ns or less.

In general, in a light emitting device, the output optical signal lags behind the input electrical signal. For instance, even if the electrical signal starts to fall, the fall of the optical pulse lags due to carriers generated inside the light emitting device. This is called the tailing or skirting phenomenon. Pulse width distortion resulting from the tailing phenomenon degrades the transmission quality and makes it difficult to increase the transmission rate.

DETAILED DESCRIPTION

In general, according to one embodiment, a light emitting device includes a substrate, a light emitting layer, a first conductivity type layer, a first distributed Bragg reflector layer and a second distributed Bragg reflector layer. The first conductivity type layer is provided between the substrate and the light emitting layer. The first distributed Bragg reflector layer is provided between the first conductivity type layer and the substrate. First layers and second layers are alternately stacked in the first distributed Bragg reflector layer. The second layers have refractive index different from refractive index of the first layers. The first distributed Bragg reflector layer has a center wavelength substantially same as emission wavelength of emission light from the light emitting layer. The second distributed Bragg reflector layer is provided between the light emitting layer and the first distributed Bragg reflector layer. Third layers and fourth layers are alternately stacked in the second distributed Bragg reflector layer. The fourth layers have refractive index different from refractive index of the third layers. The second distributed Bragg reflector layer has a center wavelength longer than the center wavelength of the first distributed Bragg reflector layer in a range of 5 nm or more and 20 nm or less, and number of the third layers is smaller than number of the first layers.

Various embodiments will be described hereinafter with reference to the accompanying drawings.

Figure 1:
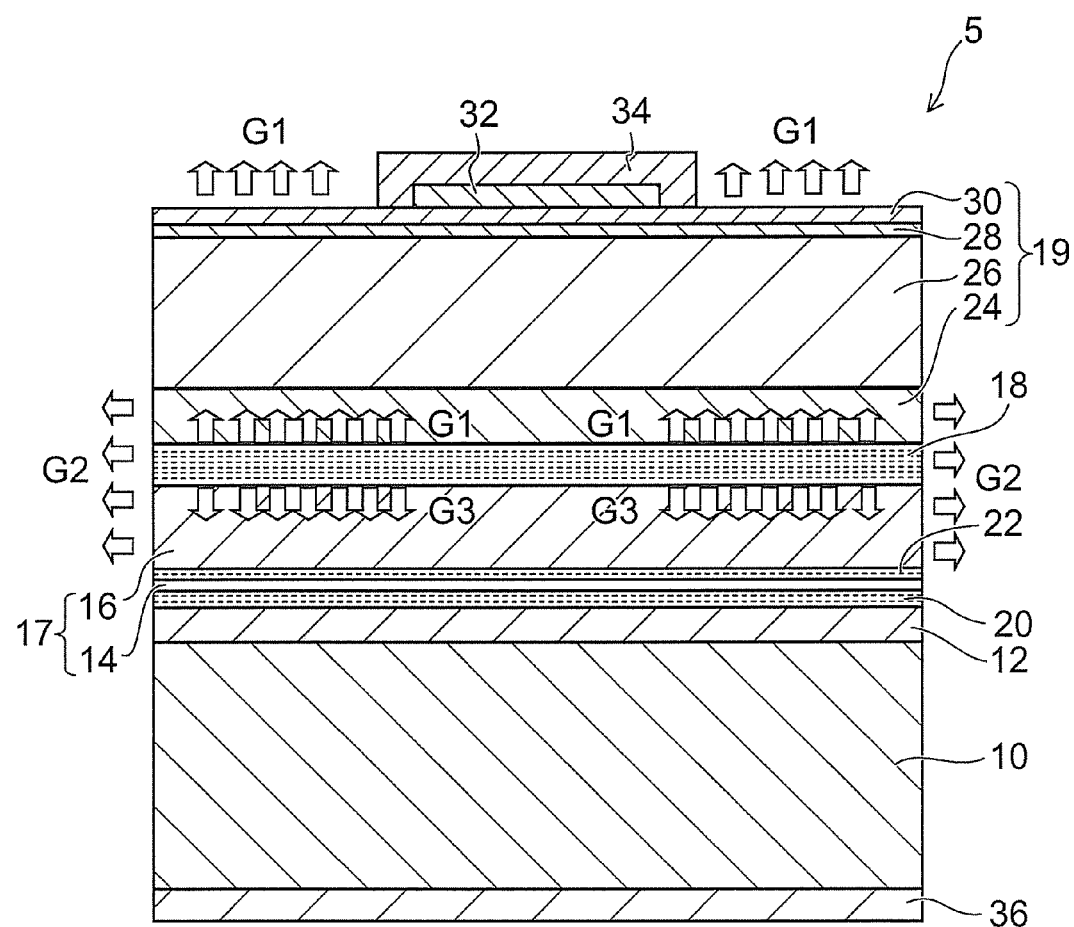
FIG. 1 is a schematic sectional view of a light emitting device according to an embodiment of the invention.

FIG. 1 is a schematic sectional view of a light emitting device according to an embodiment of the invention.

The light emitting device includes a substrate 10, a first distributed Bragg reflector layer 20, a second distributed Bragg reflector layer 22, a first conductivity type layer 17, a light emitting layer 18, a second conductivity type layer 19, a first electrode 34, and a second electrode 36.

The substrate 10, the first distributed Bragg reflector (DBR) layer 20, and the second distributed Bragg reflector (DBR) layer 22 have the first conductivity type. The light emitting layer 18 has a first surface on the substrate 10 side, and a second surface on the opposite side from the first surface. The first conductivity type layer 17 is provided on the first surface side, and the second conductivity type layer 19 is provided on the second surface side. The stacked body composed of the light emitting layer 18, the first conductivity type layer 17, the second conductivity type layer 19, the first DBR layer 20, and the second DBR layer 22 can be made of $In_x(Ga_yAl_{1-y})_{1-x}P$ ($0 \leq x \leq 1$, $0 \leq y \leq 1$), $Al_xGa_{1-x}As$ ($0 \leq x \leq 1$), or $In_xGa_yAl_{1-x-y}N$ ($0 \leq x \leq 1$, $0 \leq y \leq 1$, $x+y \leq 1$).

In FIG. 1, the substrate 10 is made of GaAs, and the first conductivity type is n-type. On the substrate 10 made of n-type GaAs, a stacked body made of $In_x(Ga_yAl_{1-y})_{1-x}P$ ($0 \leq x \leq 1$, $0 \leq y \leq 1$) is formed via a buffer layer 12 made of n-type GaAs. Here, the material of the substrate 10 and the stacked body, and the conductivity type thereof are not limited thereto.

The light emitting layer 18 can have an MQW (multiple quantum well) structure in which well layers (refractive index Nw) 18a made of $In_{0.5}(Ga_uAl_{1-u})_{0.5}P$ ($0 \leq u \leq 1$) and barrier layers (refractive index Nb) 18b made of $In_{0.5}(Ga_vAl_{1-v})_{0.5}P$ ($0 \leq v \leq 1$) are alternately stacked, where Nw>Nb. The light emitting layer 18 emits emission light G1 directed upward, emission light G2 directed laterally, and emission light G3 directed downward.

The first DBR layer 20 can be such that first layers 20a having the substantially same composition formula as the well layer 18a and second layers 20b having the substantially same composition formula as the barrier layer 18b are alternately stacked therein. The second DBR layer 22 can be such that third layers 22a having the substantially same composition formula as the well layer 18a and fourth layers 22b having the substantially same composition formula as the barrier layer 18b are alternately stacked therein. This can simplify the configuration and crystal growth process of the stacked body. The "same composition formula" means that, for instance, in the composition formula represented by $In_x(Ga_yAl_{1-y})_{1-x}P$ ($0 \leq x \leq 1$, $0 \leq y \leq 1$), not only the constituent elements (In, Ga, Al, and P in this specific example), but also x and y representing their ratios, are respectively identical. Here, the conductivity type may be either identical or different. For instance, the well layer 18a and the barrier layer 18b may be non-doped, whereas the first DBR layer 20 and the second DBR layer 22 may be of n-type.

In the first DBR layer 20, the optical path length experienced by emission light from the light emitting layer 18 passing through one pair of the first layer 20a and the second layer 20b is set to a half wavelength. Then, with the increase of the number of pairs, the reflected light beams interfere constructively, and the reflectance can be made higher. Thus, optical absorption in the substrate 10 can be reduced, and the optical output can be increased.

In this case, the optical path length of each layer may be set to about a quarter wavelength. For instance, the thickness Tw1 of the first layer 20a can be given by equation (1).

$$Tw1=(\lambda 1/Nw)/4 \quad (1)$$

where $\lambda 1$ is the free space wavelength of the emission light.

That is, Tw1 can be set to a quarter of the in-medium wavelength in the first layer 20a. Furthermore, the thickness Tb1 of the second layer 20b can be given by equation (2).

$$Tb1=(\lambda 1/Nb)/4 \quad (2)$$

Thus, the center wavelength $\lambda br1$ of the first DBR layer 20 is substantially set to the wavelength $\lambda 1$ of the emission light. On the other hand, the center wavelength $\lambda br2$ of the second DBR layer 22 is set to $\lambda 2$, longer than $\lambda 1$. This wavelength $\lambda 2$ will be described later in detail. Here, in the second DBR layer 22, the optical path length experienced by light passing through one pair of the third layer 22a and the fourth layer 22b is set to half of the wavelength $\lambda 2$. Then, with the increase of the number of pairs, the reflectance can be increased.

In this case, the optical path length of each layer may be set to a quarter of the wavelength $\lambda 2$. For instance, the thickness Tw2 of the third layer 22a can be given by equation (3).

$$Tw2=(\lambda 2/Nw)/4 \quad (3)$$

Furthermore, the thickness Tb2 of the fourth layer 22b can be given by equation (4).

$$Tb2=(\lambda 2/Nb)/4 \quad (4)$$

The first conductivity type layer 17 includes e.g. a first cladding layer 16 adjacent to the light emitting layer 18, and a second cladding layer 14. The first and second cladding layer 16, 14 can be made of n-type $In_{0.5}Al_{0.5}P$. Then, emission light can be appropriately confined in the well layer 18a, and the light emission efficiency can be increased.

The second conductivity type layer 19 includes e.g. a cladding layer 24 made of p-type $In_{0.5}Al_{0.5}P$, a current spreading layer 26 made of p-type $Al_rGa_{1-r}As$ ($0 \leq r \leq 1$), a moisture-resistant layer 28 made of p-type $In_{0.5}(Ga_qAl_{1-q})_{0.5}P$ ($0 \leq q \leq 1$), and a contact layer 30 made of p-type GaAs in this order. A current blocking layer 32 having a smaller size than the first electrode 34 can be provided. Then, the current from the first electrode 34 does not spread below the current blocking layer 32. This can reduce the current not contributing to light emission, and increase the light extraction efficiency.

While leaving the portion of the contact layer 30 immediately below the first electrode 34, the rest of the contact layer 30 can be removed. This suppresses absorption of emission light by the contact layer 30 made of GaAs, and the light extraction efficiency can be increased.

Figure 2A:
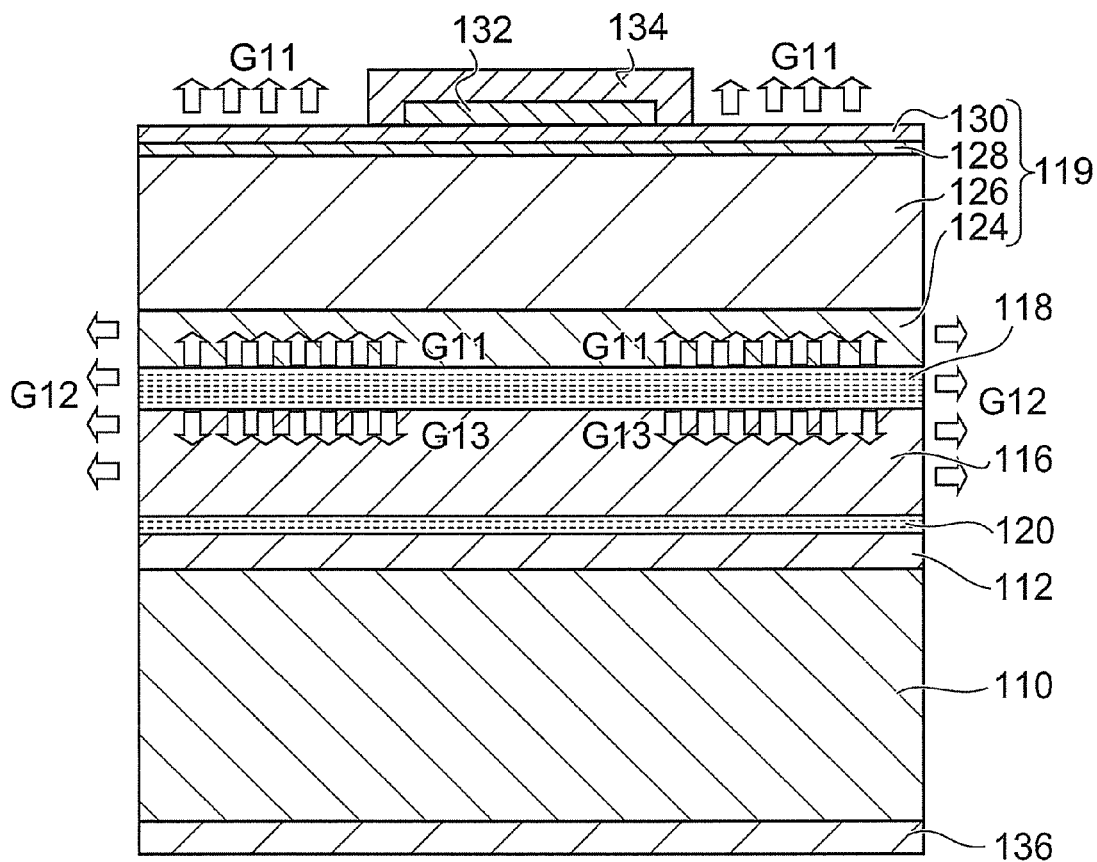
FIG. 2A is a schematic sectional view of a light emitting device according to a comparative example.
Figure 2B:
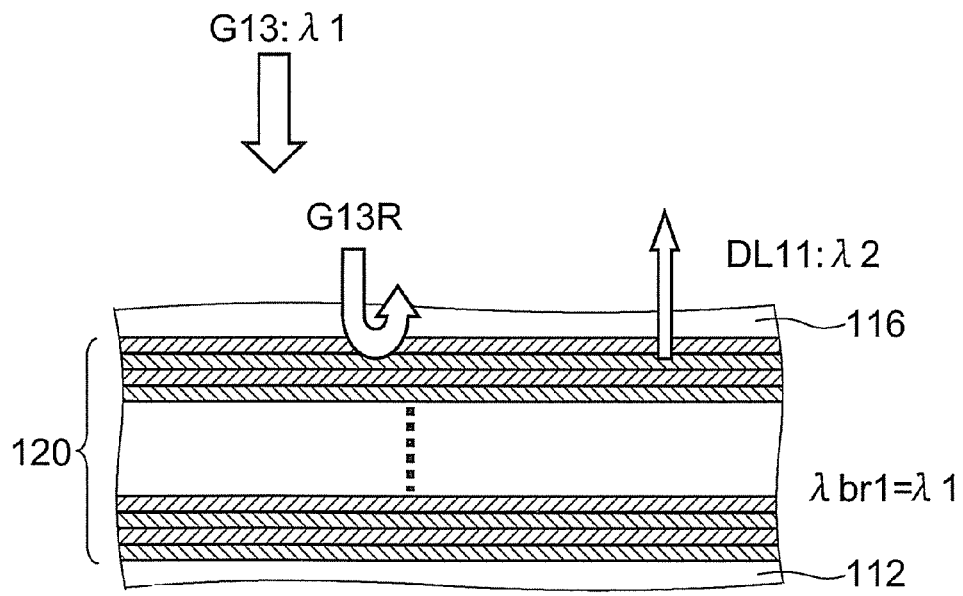
FIG. 2B illustrates the operation of a first DBR layer.

FIG. 2A is a schematic sectional view of a light emitting device according to a comparative example, and FIG. 2B illustrates the operation of the first DBR layer.

As shown in FIG. 2A, the light emitting device includes a substrate 110, a first DBR layer 120, a first conductivity type cladding layer 116, a light emitting layer 118, a second conductivity type layer 119, a first electrode 134, and a second electrode 136. The second conductivity type layer 119 includes a cladding layer 124, a current spreading layer 126, a moisture-resistant layer 128, and a contact layer 130. The substrate 110 is made of GaAs, and the first conductivity type is n-type. On the substrate 110 made of n-type GaAs, a stacked body made of $In_x(Ga_yAl_{1-y})_{1-x}P$ ($0 \leq x \leq 1, 0 \leq y \leq 1$) is formed via a buffer layer 112 made of n-type GaAs.

The light emitting layer 118 can have an MQW structure in which well layers made of $In_{0.5}(Ga_uAl_{1-u})_{0.5}P$ ($0 \leq u \leq 1$) and barrier layers made of $In_{0.5}(Ga_vAl_{1-v})_{0.5}P$ ($0 \leq v \leq 1$) are alternately stacked. The light emitting layer 118 emits emission light G11 directed upward, emission light G12 directed laterally, and emission light G13 directed downward.

The first DBR layer 120 is such that first layers made of n-type $In_{0.5}(Ga_yAl_{1-y})_{0.5}P$ ($0 \leq y \leq 1$) and second layers made of n-type $In_{0.5}Al_{0.5}P$ are alternately stacked therein. The first layer and the second layer have a refractive index difference therebetween.

The center wavelength $\lambda br1$ of the first DBR layer 120 is set to the center wavelength $\lambda 1$ of the emission light. As shown in FIG. 2B, the emission light G13 directed downward is reflected by the first DBR layer 120 and turns into reflected light G13R directed upward. Furthermore, deep levels present in the first DBR layer 120 generate light emission DL11. This will be described later.

Figure 3A:
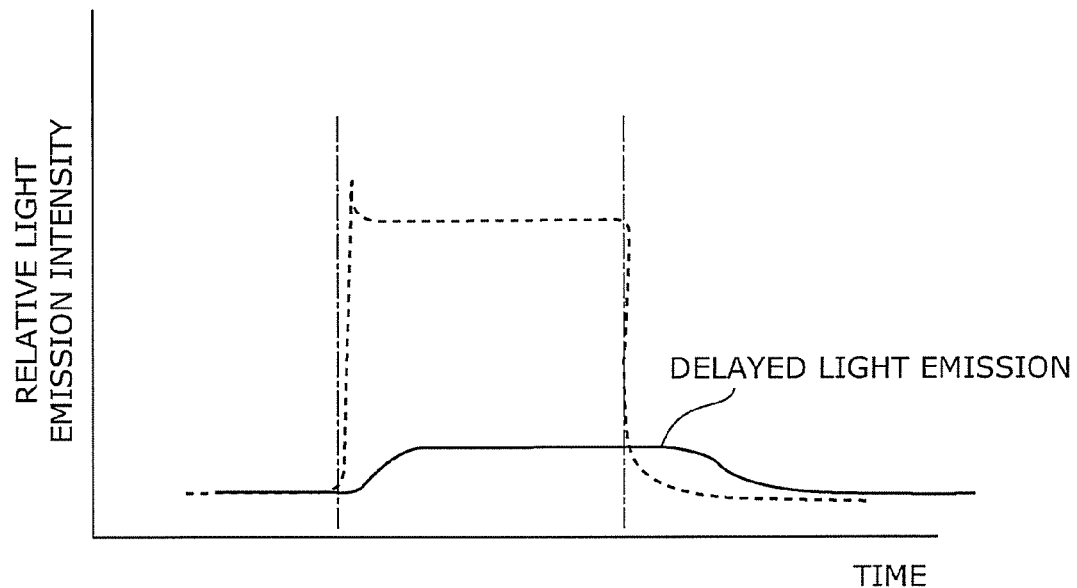
FIG. 3A is a graph illustrating delayed light emission.
Figure 3B:
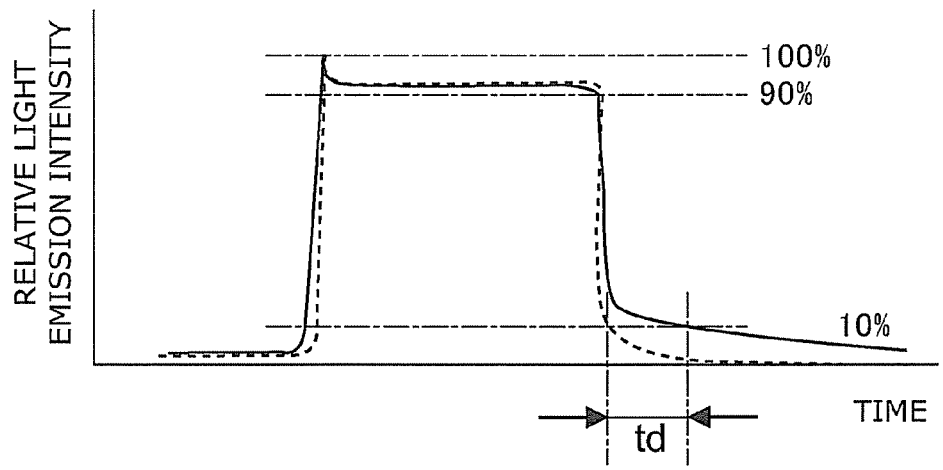
FIG. 3B is a graph illustrating the tailing phenomenon of the pulse.

FIG. 3A is a graph illustrating delayed light emission in the comparative example, and FIG. 3B is a graph illustrating the tailing phenomenon of the pulse.

In FIG. 3A, the vertical axis represents relative light emission intensity, and the horizontal axis represents time. The solid line represents a waveform of the delayed light emission component. On the other hand, the dashed line represents a waveform not including the delayed light emission component.

A high-speed optical transmission link requires that the rise time tr at the rising edge (tr, specified by 10/90% of the pulse height) be 20 ns or less and the fall time td at the falling edge (td, specified by 90/10% of the pulse height) be 10 ns or less. However, as shown in FIG. 3B, the light emission pulse of the comparative example has a delay time at the rising and falling edge. Because of the presence of the delayed light emission component, the falling time td may exceed 10 ns due to the tailing phenomenon at the falling edge. As a result, the output pulse signal obtained by converting the optical pulse to an electrical pulse has a larger width than the input pulse signal and causes pulse width distortion. Such pulse width distortion increases the bit error rate and degrades the transmission quality.

Figure 4:
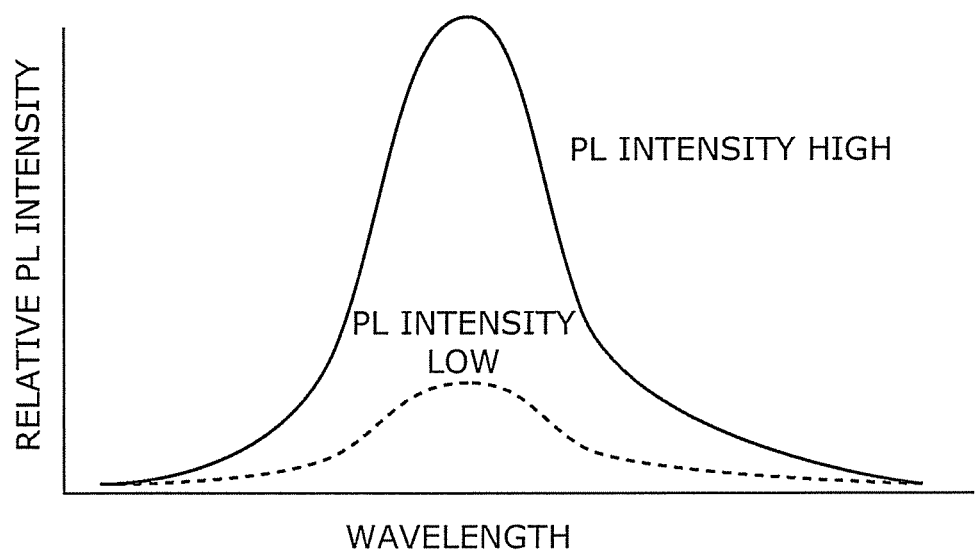
FIG. 4 is a graph illustrating the dependence of photoluminescence intensity on wavelength.

FIG. 4 is a graph illustrating the dependence of photoluminescence (PL) intensity on wavelength.

Typically, a semiconductor crystal contains crystal defects and impurities. These defects form specific energy levels in the band gap. Excessive electrons and holes generated by photoexcitation in PL measurement emit light with a different wavelength from emission light of the band gap wavelength intrinsic to the crystal. Thus, the crystalline quality can be known by measuring the PL intensity. The PL intensity in the DBR layer depends on the surface condition of the substrate. For instance, the PL intensity of the solid line is generally 10 times as high as the PL intensity of the dashed line. For a high PL intensity like the solid line, donor-acceptor pairs at deep levels present in the DBR layer are strongly excited by the operating current. The inventors have discovered that in the comparative example, light emission from donor-acceptor pairs at deep levels in the first DBR layer 120 lags 1-20 ns behind the emission light.

If the number of pairs in the first DBR layer 120 can be decreased in the comparative example, then the delayed light emission component can be reduced, and it is expected that the pulse width distortion is easily reduced. However, reduction of the number of pairs results in decreasing the reflectance of the first DBR layer 120 and decreasing the optical output. This shortens the transmissible distance.

Figure 5A:
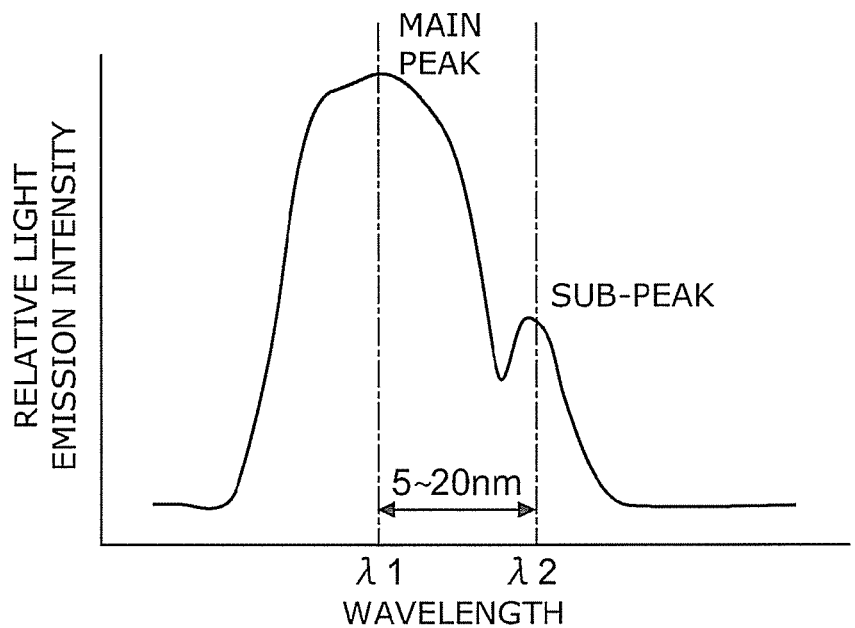
FIGS. 5A and 5B are graphs illustrating spectra of light including delayed light emission.
Figure 5B:
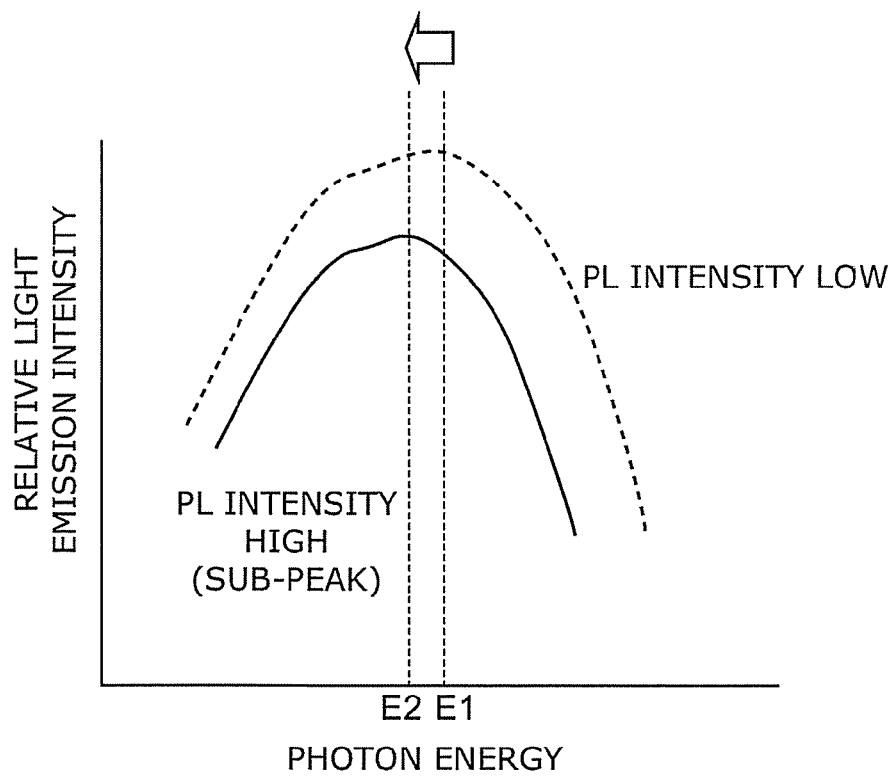

FIGS. 5A and 5B are graphs illustrating spectra of light including delayed light emission.

In FIG. 5A, the vertical axis represents relative light emission intensity, and the horizontal axis represents wavelength. In FIG. 5B, the vertical axis represents relative light emission intensity, and the horizontal axis represents photon energy.

The light emitting layer made of $In_x(Ga_yAl_{1-y})_{1-x}P$ ($0 \leq x \leq 1$, $0 \leq y \leq 1$) can emit light in the wavelength range of 600-700 nm. For optical pulses with tailing including the delayed light emission component, the inventors performed measurements using an optical spectrometer. By these measurements, the inventors have discovered that the main peak $\lambda 1$ of the spectrum is accompanied by a sub-peak (wavelength $\lambda 2$) spaced 5-20 nm on the long wavelength side.

Furthermore, as shown in FIG. 5B, with respect to the photon energy E1 for a low PL intensity with less delayed light emission component, the photon energy E2 of the sub-peak resulting from the delayed light emission component for a high PL intensity is shifted to the low energy side. This is parallel to the fact that the wavelength $\lambda 2$ of the sub-peak corresponding to the low photon energy E2 is shifted from the wavelength $\lambda 1$ of the main peak by 5-20 nm on the long wavelength side. Based on this knowledge, in the embodiment, the second DBR layer 22 is provided between the first DBR layer 20 and the light emitting layer 18 so that the wavelength component around the sub-peak can be reflected.

Figure 6:
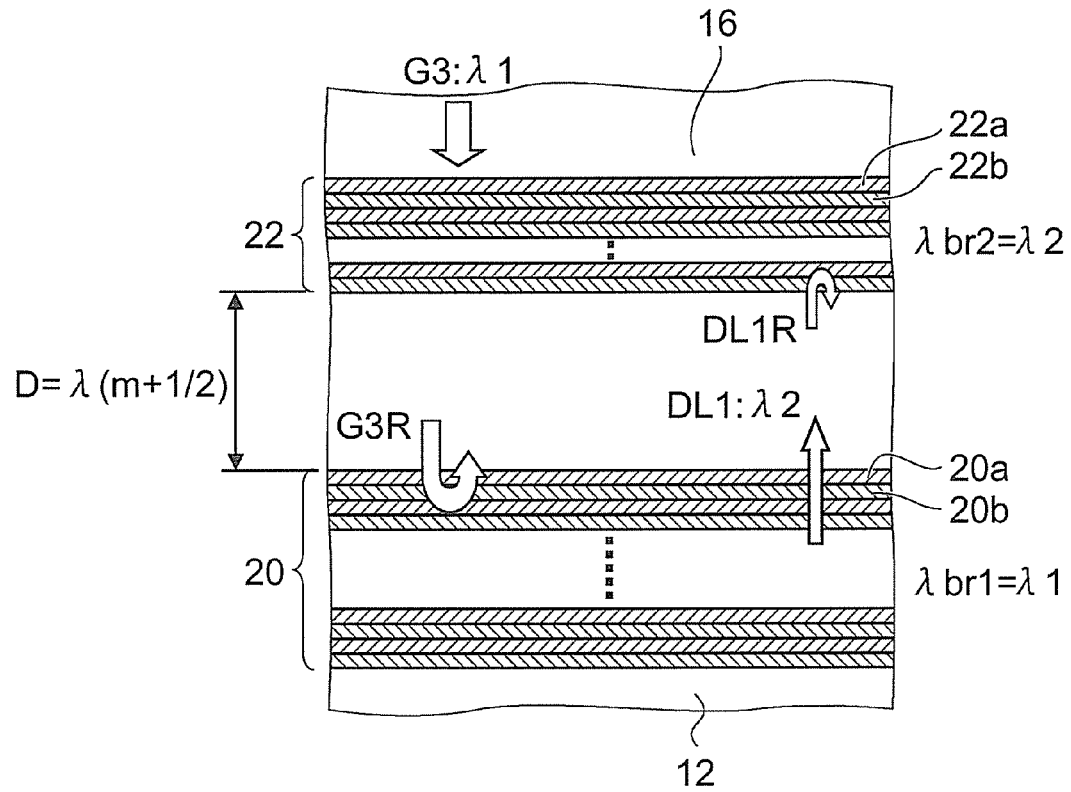
FIG. 6 is a schematic view illustrating the operation of the first and second DBR layer in the embodiment.

FIG. 6 is a schematic view illustrating the operation of the first and second DBR layer in the embodiment.

The emission light G3 having center wavelength $\lambda 1$ and directed downward from the light emitting layer 18 can pass through the second DBR layer 22 whose center wavelength $\lambda br2$ is longer than $\lambda 1$. On the other hand, deep levels in the first DBR layer 20 generate the delayed light emission component DL1 corresponding the sub-peak (wavelength $\lambda 2$). However, most of the delayed light emission component DL1 is reflected by the second DBR layer 22 whose center wavelength $\lambda br2$ is substantially same as $\lambda 2$. This suppresses external emission of the delayed light emission component DL1. That is, the wavelength component around the main peak of the emission light is selectively emitted outside. This suppresses delay of the optical pulse and reduces pulse width distortion. Thus, high transmission quality can be maintained.

Here, number of pairs of the second DBR layer 22 is defined as number of the third layers 22a. And number of pairs of the first DBR layer 20 is defined as number of the first layers 20a. Then, the number of the third layers 22a of the second DBR layer 22 is smaller than the number of the first layers 20a of the first DBR layer 20. Hence, the intensity of the delayed light emission component DL1 can be reduced. Furthermore, because $\lambda br2 = \lambda 2$, the delayed light emission component transmitted through the second DBR layer 22 and emitted outside is reduced. Here, the number of pairs of the second DBR layer 22 is preferably 10 or more to reflect the delayed light emission component while transmitting the emission light.

If the number of pairs of the first DBR layer 20 is 20 or more, the reflectance of emission light directed to the substrate is easily increased. However, if the number of pairs is too large, the delayed light emission component increases. Hence, the number of pairs is preferably 40 or less. Furthermore, more preferably, the number of pairs of the third layer 22a and the fourth layer 22b alternately stacked is made half or less the number of pairs of the first layer 20a and the second layer 20b alternately stacked. This is because the external emission of the delayed light emission component generated in the first DBR layer 20 is then suppressed.

A second cladding layer 14 made of e.g. n-type $In_{0.5}Al_{0.5}P$ can be provided between the first DBR layer 20 and the second DBR layer 22. This facilitates confining light in each DBR layer. Furthermore, the distance D between the first DBR layer 20 and the second DBR layer 22 can be given by equation (5), for instance. This can facilitate operating the first DBR layer 20 and the second DBR layer 22 more independently.

$$D = \lambda cl(m+1/2) \quad (5)$$

where $\lambda cl$ is the wavelength of the emission light in the second cladding layer and m is an integer.

Figure 7:
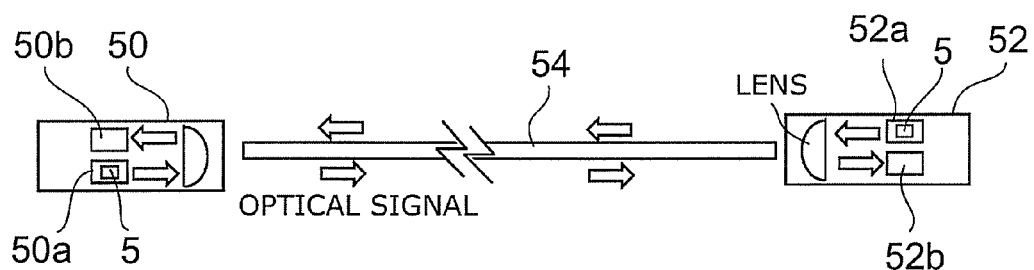
FIG. 7 is a schematic view of an optical transmission system of the embodiment.

FIG. 7 is a schematic view of an optical transmission system of the embodiment.

The optical transmission system includes an optical transmission device 50, an optical transmission device 52, and an optical fiber 54. The optical transmission device 50 is coupled to one end of the optical fiber 54 through e.g. an optical connector. The optical transmission device 52 is coupled to the other end of the optical fiber 54 through e.g. an optical connector. If the center wavelength of the emission light of the light emitting device 5 is set in the range of 600-700 nm, then POF (plastic optical fiber) can be used to achieve a transmission distance of approximately 50 m. If the center wavelength of the emission light is set in the range of 700-900 nm, then PCF (plastic cladding silica fiber) can be used to achieve a transmission distance of approximately 1000 m.

The optical transmission device 50 includes an optical transmitter 50a including a light emitting device 5, an optical receiver 50b including a light receiving device, an optical component, and a control circuit unit. The optical transmission device 52 includes an optical transmitter 52a including a light emitting device 5, an optical receiver 52b including a light receiving device, an optical component, and a control circuit unit. The light emitting device 5 of the embodiment can be used to achieve a high-speed optical transmission system with reduced pulse width distortion and improved transmission quality. Furthermore, because external emission of the delayed light emission component is suppressed inside the light emitting device 5, there is no need to externally provide a band reject filter, and the configuration of the optical transmission device can be simplified. While FIG. 7 shows a bidirectional optical transmission system, the embodiment is also applicable to a unidirectional optical transmission system.

Such an optical transmission system can be used for data transmission between electronic equipments, control of industrial equipments, and optical communication. In this case, high-speed transmission at 100 Mbps is easily achieved, and high capacity data can be transmitted.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A light emitting device comprising:
    a substrate;
    a light emitting layer;
    a first conductivity type layer provided between the substrate and the light emitting layer;
    a first distributed Bragg reflector layer provided between the first conductivity type layer and the substrate, with first layers and second layers alternately stacked in the first distributed Bragg reflector, the second layers having refractive index different from refractive index of the first layers, the first distributed Bragg reflector layer having a center wavelength substantially same as emission wavelength of emission light from the light emitting layer;
    a second distributed Bragg reflector layer provided between the light emitting layer and the first distributed Bragg reflector layer, with third layers and fourth layers alternately stacked in the second distributed Bragg reflector layer, the fourth layers having refractive index different from refractive index of the third layers, the second distributed Bragg reflector layer having a center wavelength longer than the center wavelength of the first distributed Bragg reflector layer in a range of 5 nm or more and 20 nm or less, and number of the third layers being smaller than number of the first layers.

2. The device according to claim 1, wherein
    the light emitting layer includes well layers and barrier layers having refractive index lower than refractive index of the well layer,
    a composition formula of the first and third layers is substantially same as a composition formula of the well layers, and
    a composition formula of the second and fourth layers is substantially same as a composition formula of the barrier layers.

3. The device according to claim 1, wherein a stacked body including the light emitting layer, the first conductivity type layer, the first distributed Bragg reflector layer, and the second distributed Bragg reflector layer includes $In_x(Ga_yAl_{1-y})_{1-x}P$ ($0 \leq x \leq 1$, $0 \leq y \leq 1$).

4. The device according to claim 1, wherein a stacked body including the light emitting layer, the first conductivity type layer, the first distributed Bragg reflector layer, and the second distributed Bragg reflector layer includes one of $Al_xGa_{1-x}As$ ($0 \leq x \leq 1$) and $In_xGa_yAl_{1-x-y}N$ ($0 \leq x \leq 1$, $0 \leq y \leq 1$, $x+y \leq 1$).

5. The device according to claim 3, wherein the light emitting layer has a multiple quantum well structure in which well layers made of $In_{0.5}(Ga_uAl_{1-u})_{0.5}P$ ($0 \leq u \leq 1$) and barrier layers made of $In_{0.5}(Ga_vAl_{1-v})_{0.5}P$ ($0 \leq v \leq 1$) are alternately stacked.

6. The device according to claim 5, wherein
    a composition formula of the first and third layers is substantially same as a composition formula of the well layers, and
    a composition formula of the second and fourth layers is substantially same as a composition formula of the barrier layers.

7. The device according to claim 1, wherein
    the first conductivity type layer includes a first cladding layer adjacent to the light emitting layer, and a second cladding layer, and
    the second distributed Bragg reflector layer is provided between the first cladding layer and the second cladding layer.

8. The device according to claim 2, wherein
    the first conductivity type layer includes a first cladding layer adjacent to the light emitting layer, and a second cladding layer, and
    the second distributed Bragg reflector layer is provided between the first cladding layer and the second cladding layer,
    a stacked body including the light emitting layer, the first conductivity type layer, the first distributed Bragg reflector layer, and the second distributed Bragg reflector layer includes $In_x(Ga_yAl_{1-y})_{1-x}P$ ($0 \leq x \leq 1$, $0 \leq y \leq 1$),
    the well layers, the first layers, and the third layers are made of $In_{0.5}(Ga_uAl_{1-u})_{0.5}P$ ($0 \leq u \leq 1$),
    the barrier layers, the second layers, and the fourth layers are made of $In_{0.5}(Ga_vAl_{1-v})_{0.5}P$ ($0 \leq v \leq 1$), and
    the first and second cladding layers are made of $In_{0.5}Al_{0.5}P$.

9. The device according to claim 1, wherein
    the number of the first layers is in a range of 20 or more and 40 or less, and
    the number of the third layers is half or less the number of the first layers.

10. The device according to claim 1, wherein
    a thickness of the first layers is about a quarter of in-medium wavelength corresponding to the emission light from the light emitting layer,
    a thickness of the second layers is about a quarter of the in-medium wavelength corresponding to the emission light,
    a thickness of the third layers is about a quarter of in-medium wavelength corresponding to the center wavelength of the second distributed Bragg reflector layer, and
    a thickness of the fourth layers is about a quarter of the in-medium wavelength corresponding to the center wavelength of the second distributed Bragg reflector layer.

11. The device according to claim 1, further comprising:
    an electrode provided on a side of the light emitting layer opposite to the substrate; and
    a second conductivity type layer provided between the light emitting layer and the electrode.

12. The device according to claim 11, wherein the second conductivity type layer includes a third cladding layer, a current spreading layer, and a contact layer provided from the side of the light emitting layer to a side of the electrode.

13. The device according to claim 12, further comprising:
    a current blocking layer selectively provided on the contact layer.

14. The device according to claim 13, wherein the electrode is provided so as to cover an upper surface and a side surface of the current blocking layer and a part of the contact layer.

15. The device according to claim 3, further comprising:
    an electrode provided on a side of the light emitting layer opposite to the substrate; and
    a second conductivity type layer including a third cladding layer, a current spreading layer, and a contact layer provided from the side of the light emitting layer to a side of the electrode.

16. The device according to claim 15, wherein
    the third cladding layer is made of $In_{0.5}Al_{0.5}P$,
    the current spreading layer is made of $Al_rGa_{1-r}As$ ($0 \leq r \leq 1$), and
    the contact layer is made of GaAs.

17. An optical transmission system comprising:
an optical transmitter including a light emitting device including:
- a substrate;
- a light emitting layer;
- a first conductivity type layer provided between the substrate and the light emitting layer;
- a first distributed Bragg reflector layer provided between the first conductivity type layer and the substrate, with first layers and second layers alternately stacked in the first distributed Bragg reflector layer, the second layers having refractive index different from refractive index of the first layers, the first distributed Bragg reflector layer having a center wavelength substantially same as emission wavelength of emission light from the light emitting layer;
- a second distributed Bragg reflector layer provided between the light emitting layer and the first distributed Bragg reflector layer, with third layers and fourth layers alternately stacked therein, the fourth layers having refractive index different from refractive index of the third layers, the second distributed Bragg reflector layer having a center wavelength longer than the center wavelength of the first distributed Bragg reflector layer in a range of 5 nm or more and 20 nm or less, and number of the third layers being smaller than number of the first layers, the optical transmitter being capable of externally emitting the emission light from the light emitting layer as an optical pulse;
an optical fiber capable of transmitting the optical pulse; and
an optical receiver capable of converting the optical pulse emitted from the optical fiber to an electrical pulse.

18. The system according to claim 17, wherein the center wavelength of the emission light is 600 nm or more and 700 nm or less.

19. The system according to claim 18, wherein the optical fiber is one of a plastic optical fiber and a plastic cladding silica fiber.

20. The system according to claim 19, wherein the optical fiber is a multi-mode fiber.

* * * * *